United States Patent
Koita et al.

(10) Patent No.: US 6,992,050 B2
(45) Date of Patent: *Jan. 31, 2006

(54) STRIPPING AGENT COMPOSITION AND METHOD OF STRIPPING

(75) Inventors: Tatsuya Koita, Tokyo (JP); Keiji Hirano, Tokyo (JP); Hidemitsu Aoki, Tokyo (JP); Hiroaki Tomimori, Tokyo (JP)

(73) Assignee: NEC Corporation (JP)

( * ) Notice: Subject to any disclaimer, the term of this patent is extended or adjusted under 35 U.S.C. 154(b) by 88 days.

This patent is subject to a terminal disclaimer.

(21) Appl. No.: 10/312,415

(22) PCT Filed: Jun. 27, 2001

(86) PCT No.: PCT/JP01/05505

§ 371 (c)(1),
(2), (4) Date: Dec. 26, 2002

(87) PCT Pub. No.: WO02/01300

PCT Pub. Date: Jan. 3, 2002

(65) Prior Publication Data

US 2004/0029051 A1 Feb. 12, 2004

(30) Foreign Application Priority Data

Jun. 28, 2000 (JP) ........................................ 2000-194981

(51) Int. Cl.
*C11D 17/00* (2006.01)

(52) U.S. Cl. .................. 510/176; 510/255; 510/405; 510/499; 510/500; 510/501; 510/502; 510/503; 510/504

(58) Field of Classification Search ................. 510/176, 510/255, 405, 499, 500, 501, 502, 503, 504
See application file for complete search history.

(56) References Cited

U.S. PATENT DOCUMENTS

| 5,648,324 A | * | 7/1997 | Honda et al. ............... 510/176 |
| 5,795,702 A | | 8/1998 | Tanabe et al. .............. 430/331 |
| 2003/0130147 A1 | * | 7/2003 | Koito et al. ................. 510/175 |
| 2003/0173671 A1 | * | 9/2003 | Hironaga et al. ........... 257/758 |

FOREIGN PATENT DOCUMENTS

| JP | 07-219241 | 8/1995 |
| JP | 07-244386 | 9/1995 |
| JP | 09-244263 | 9/1997 |
| JP | 09-291381 | 11/1997 |
| JP | 10-171130 | 6/1998 |
| JP | 2000-047401 | 2/2000 |
| JP | 2000-089481 | 3/2000 |
| JP | 2000-178772 | 6/2000 |
| WO | WO 98/50516 | 11/1998 |

* cited by examiner

*Primary Examiner*—Barbara L. Gilliam
(74) *Attorney, Agent, or Firm*—Hayes Soloway P.C.

(57) ABSTRACT

A stripping composition comprising (a) an anticorrosive agent, (b) a stripping agent and (c) a solvent, wherein the anticorrosive agent (a) is a heterocyclic compound having a nitrogen atom-containing six-membered ring.

10 Claims, 3 Drawing Sheets

(a)

(b)

(c)

STRIPPING AGENT COMPOSITION AND METHOD OF STRIPPING

TECHNICAL FIELD

The present invention relates to a stripping composition used for removing unnecessary substances remaining on a semiconductor substrate in the process for production of semiconductor device, for example, a resist film and an etching residue both remaining after dry etching of insulating film, as well as to a stripping method.

BACKGROUND ART

The steps for forming throughholes, wiring grooves, etc., employed in the process for production of semiconductor device are conducted using lithography. They are conducted ordinarily by forming a resist film, then conducting dry etching using the resist film as a mask, and then removing the resist film. Here, the removal of the resist film is conducted generally by plasma ashing and subsequent wet treatment using a stripping solution. As the stripping solution, various solutions have heretofore been developed and there are known, for example, organic sulfonic acid-based stripping solutions containing an alkylbenzene-sulfonic acid as the main component, organic amine-based stripping solutions containing an amine (e.g. monoethanolamine) as the main component, and hydrofluoric acid-based stripping solutions containing hydrofluoric acid or a salt thereof as the main component.

Meanwhile, in recent years, low-resistance wiring materials such as copper have come to be used in response to the higher speed required for semiconductor elements, and it has become necessary that stripping solutions have anticorrosivity for wiring materials. The reason is that copper, as compared with conventional wiring materials such as aluminum, is inferior in anticorrosivity to stripping solutions and tends to corrode during a stripping step.

As a technique for preventing a metal film formed on a semiconductor substrate, from corroding, there is disclosed, in JP-A-7-247498, a technique for preventing corrosion of aluminum alloy by using, for cleaning after ashing, an aqueous solution containing a quaternary ammonium hydroxide, a saccharide or a sugar alcohol, and a urea compound. In this document is shown specifically a cleaning solution comprising tetramethylammonium hydroxide, sorbitol, urea and water. When a wiring is formed using an aluminum alloy film composed mainly of aluminum, steps are taken which comprise forming a photoresist of predetermined pattern on an aluminum alloy film and then dry-etching the aluminum alloy film using the photoresist as a mask. After the dry-etching, there is formed, on the side wall of the aluminum alloy film, a side wall-protecting film which is a product of reaction between the photoresist and the dry etching gas used. In this case, since a chlorine-based gas is generally used as the dry etching gas, there has been a problem that chlorine is taken into the side wall-protecting film and the aluminum alloy film is corroded after the completion of the etching. In the technique disclosed in JP-A-7-247498, it is described that the side wall-protecting film containing chlorine can be removed effectively by using a cleaning solution having the above-mentioned particular composition. This technique is intended to efficiently remove the chlorine-containing side wall-protecting film (which causes corrosion of aluminum alloy film) and improve the stripping performance of resist-stripping solution; however, the technique does not provide an anticorrosive agent which is effective for corrodible metals such as high-purity copper.

Meanwhile, a resist-stripping solution used for anticorrosion and cleaning of metal is disclosed in, for example, JP-A-8-334905. In this document, there are shown, as examples of anticorrosive agent, aromatic hydroxy compounds such as catechol, pyrogallol and hydroxybenzoic acid and carboxyl group-containing organic compounds such as acetic acid, citric acid and succinic acid. These anticorrosive agents, however, are intended to prevent corrosion of aluminum-copper alloys composed mainly of aluminum and have no sufficient anticorrosivity for high-purity copper of high corrodibility. In the above JP-A-8-334905 are disclosed, as other anticorrosive agents, benztriazole (BTA) and derivatives thereof. When this anticorrosive agent is used, certain anticorrosivity is obtained even to corrodible metals like copper.

BTA and derivatives thereof, however, are difficult to subject to biodegradation and the treatment of a waste solution containing them has been difficult. In recent years, a requirement for lower environmental load has become strong and higher safety has become necessary also for chemical substances used in factories producing semiconductor devices. Organic wastewaters generated in the factories are generally subjected to a biological treatment and, after decomposition, are discharged. Regarding substances incapable of being subjected to any biological treatment, it is desired to treat them using other means or change them to other chemical substance showing biodegradability. The above-mentioned TBA or derivatives thereof are extremely difficult to subject to the biological treatment. For the above reasons, in the factories using a stripping solution containing BTA or a derivative thereof, the waste solution or wastewater generated has had to be treated at a high environmental risk or by a method other than biodegradation, requiring a high cost and much labor.

In JP-A-9-291381 is described a conventional technique different from the present invention, that is, effectiveness of a urea condensation product as a water-soluble rust preventive. As examples of the urea condensation product, there are shown isocyanuric acid, hydantoin, uric acid, triscarboxymethylisocyanuric acid and triscarboxyethylisocyanuric acid. This technique, however, aims at rust prevention of metal during metal processing (e.g. cutting, polishing and plastic processing) and storage of worked metal and is not intended to provide a technique for removal of residue remaining in very fine holes and high-level surface cleaning, such as required in semiconductor device production. Further, the technique described in the above document aims at rust prevention of metal and has a task different from that ("anticorrosion") of the present invention.

"Rust prevention" is to prevent the progress of oxidation of metal. In contrast, the "anticorrosion" aimed at in the present invention is to prevent corrosion of a metal film formed on a semiconductor wafer, specifically to prevent dissolution of metal (e.g. copper) or formation of metal complex, using a stripping component contained in resist-stripping solution. Treatment by rust preventive is conducted ordinarily in air and forms a protective layer made of rust preventive, on an oxide film present on a metal. In contrast, the "anticorrosion" of the present invention forms a protective layer on a clean metal surface not oxidized, by allowing an anticorrosive agent to act on the surface. A metal film formed on a semiconductor wafer, even when the surface has been oxidized (i.e. rusted) slightly, produces various problems such as increased resistance, insufficient adhesion with a film formed thereon, and the like. Therefore, the anticorrosive agent of the present invention is required to form a dense protective film on a metal film for substantially complete prevention of the oxidation of the metal film and further for effective prevention of the dissolution of the metal film and the formation of a metal complex both caused by a resist-stripping solution or a cleaning solution. That is, in the "anticorrosion" of the present invention is required a high-degree of metal film protectability rather than rust prevention. Further, as described later, the anticorrosive agent used in resist-stripping composition, unlike ordinary anticorrosive agents for metal members, is needed to have various properties. Thus, in designing a resist-stripping composition used in production of semiconductor device, an investigation must be made from standpoints different from those required in ordinary rust prevention of metals.

DISCLOSURE OF THE INVENTION

The present invention has been made in consideration of the above situation and aims at providing a stripping composition which can effectively remove a resist film and an etching residue while preventing the corrosion of a corrodible metal such as copper and which is superior in product safety, is subjectable to a biological treatment and is easy to treat its wastewater.

Development of an anticorrosive agent used in a resist-stripping solution has been made mainly for improvement of anticorrosivity to wiring material. In order to further consider lower environmental risk such as safety and biodegradability, an investigation based on standpoints different from conventional standpoints is needed. The present inventors made an investigation from such standpoints and found out that heterocyclic compounds having a particular structure have good anticorrosivity. The finding has led to the completion of the present invention.

According to the present invention there is provided a stripping composition comprising (a) an anticorrosive agent, (b) a stripping agent and (c) a solvent, wherein the anticorrosive agent (a) is a heterocyclic compound having a nitrogen atom-containing six-membered ring.

According to the present invention there is also provided a stripping composition comprising (a) an anticorrosive agent, (b) a stripping agent and (c) a solvent, wherein the anticorrosive agent (a) is a heterocyclic compound having a five- or six-membered heterocyclic ring containing an atomic group of —C(OH)=N— or —CONH—.

According to the present invention there is also provided a stripping composition comprising (a) an anticorrosive agent, (b) a stripping agent and (c) a solvent, wherein the anticorrosive agent (a) is purine or a derivative thereof.

According to the present invention there is also provided a stripping composition comprising (a) an anticorrosive agent, (b) a stripping agent and (c) a solvent, wherein the anticorrosive agent (a) is a compound represented by the following general formula (1):

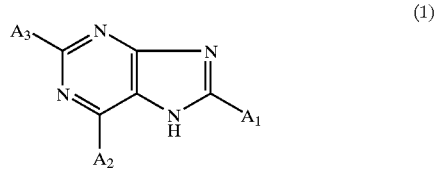

(1)

wherein $A_1$, $A_2$ and $A_3$ are each independently a hydrogen atom, a hydroxyl group, an alkyl group having 1 to 5 carbon atoms or an amino group.

According to the present invention there is provided a stripping method which comprises removing a resist film and/or an etching residue, present on a semiconductor substrate containing an exposed metal film surface, using the above-mentioned stripping composition.

According to the present invention there is also provided a stripping method which comprises forming a metal film and an insulating film on a semiconductor wafer in this order, forming a resist film thereon, conducting dry etching using the resist film as a mask, to form, in the insulating film, a hollow reaching the metal film, and removing the resist film and/or a reside of etching, wherein the removal is conducted using the above-mentioned stripping composition.

According to the present invention there is also provided a stripping method which comprises forming, on a semiconductor wafer, a metal film, a first insulating film and a second insulating film having a predetermined opening in this order, conducting dry etching using the second insulating film as a mask, to form, in the first insulating film, a hollow reaching the metal film, and removing a residue of etching, wherein the removal is conducted using the above-mentioned stripping composition.

In the above stripping methods, the metal film can be a film made of, for example, copper or a copper alloy.

In the present invention, there is used, as the anticorrosive agent, a heterocyclic compound having a particular structure, such as mentioned above; therefore, a dense protecting layer is formed on a metal film and excellent anticorrosivity is exhibited. Further, the compound is superior in product safety and has biodegradability, making its wastewater treatment easy.

The stripping composition of the present invention is used, mainly in production of semiconductor device, for removal of a resist film and a residue thereof and also for removal of, for example, a residue remaining after an interlayer dielectric has been etched without forming a resist film.

In the present invention, the anticorrosive agent is used as a component of the stripping composition and, therefore, unlike ordinary anticorrosive agents for metal members, need to have various properties.

Firstly, in production of semiconductor device, since the properties intended in designing are often unobtainable even when part of the metal wiring has been damaged slightly, the anticorrosive agent used needs to have very high-level anticorrosivity. In addition, such high-level stripping performance need be exhibited in coexistence of a stripping component such as amine or hydrofluoric acid salt.

Secondly, the anticorrosive agent used needs to give no damage to a semiconductor substrate and various films formed thereon. In recent production of semiconductor device, chips are becoming increasingly finer and, even when the substrate and films constituting a semiconductor device have been damaged slightly, the properties of chips may be damaged decisively.

Thirdly, the anticorrosive agent needs to give no adverse effect in the steps conducted after a stripping treatment. For example, when an insulating film or other metal film is formed on a metal film having thereon a remaining anticorrosive agent, properties of chips may be adversely affected owing to increased resistance, film stripping, etc. Therefore, it is desired to select such an anticorrosive agent as to show no adverse effect on chip properties even when remaining or to be detached from a metal film after an anticorrosive treatment but before proceeding to the nest step.

Fourthly, since the anticorrosive agent is used in production of semiconductor device, the amount of its waste solution is large and the treatment thereof need be conducted, in particular, safely rapidly and at a low cost. Therefore, it is strongly required that the anticorrosive agent is constituted by biodegradable components.

The anticorrosive agent contained in the stripping composition of the present invention has all the above properties. That is, the anticorrosive agent contained in the stripping composition of the present invention exhibits high anticorrosivity even under the coexistence of a stripping agent and gives no damage to substrate or other films. Further, the anticorrosive agent adhering to a metal film can be quickly detached by, for example, preheating for film formation. Furthermore, the present anticorrosive agent is superior in safety and biodegradability.

BEST MODE FOR CARRYING OUT THE INVENTION

Figure 1:
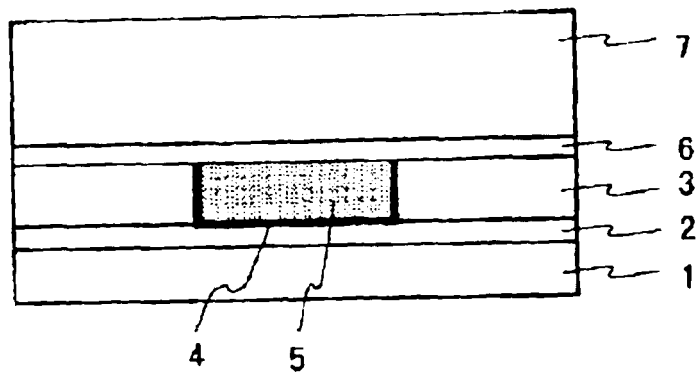
FIGS. 1(a)–1(c) are sectional views explaining steps for throughhole formation process.
Figure 1:
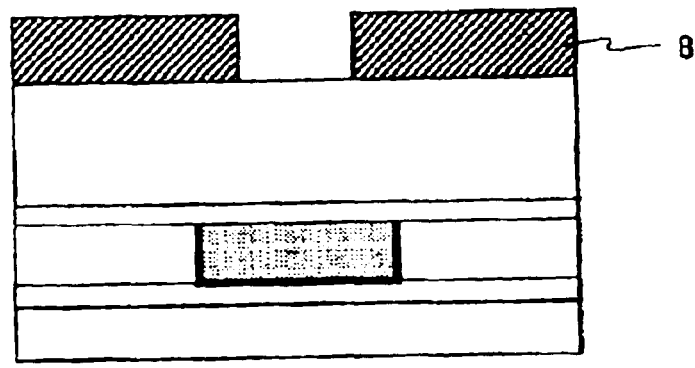
Figure 1:
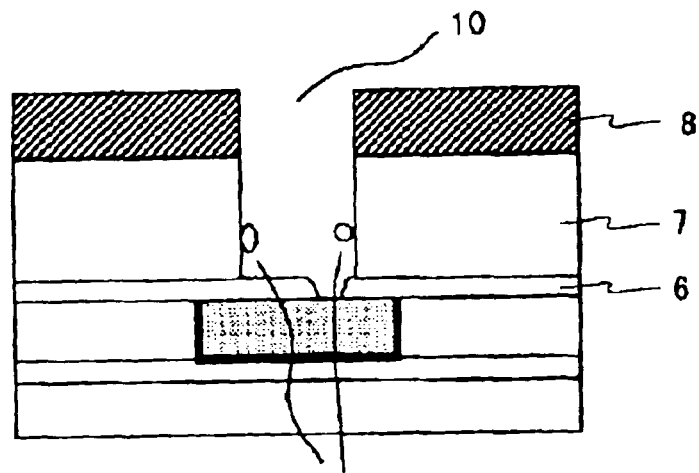

In the present invention, the component (a) contains a heterocyclic compound having a nitrogen atom-containing six-membered ring in the molecule. Such a heterocyclic compound exhibits good anticorrosivity owing to the chelating action expressed by the nitrogen atom present in the heterocyclic ring and also has good biodegradability.

When there is used, as the component (a), a heterocyclic compound having a five- or six-membered heterocylic ring containing an atomic group of —C(OH)=N— or —CONH—, the compound exhibits particularly good anticorrosivity and biodegradability. The reason is not clear but is presumed to be as follows:

In the above heterocyclic compound, C, N, O and H are on the same plane; therefore, —C(OH)=N— (amide unit) and —CONH— (iminohydrin unit) show tautomerism. This is known as lactam-lactim tautomerism (the following formula).

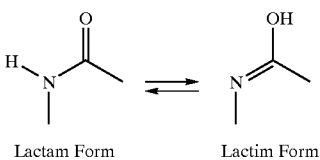

Lactam Form     Lactim Form

In the above formula, a conjugated system is formed on N, C and O atoms and, electrons are delocalized at this conjugated region. Since the electrons in the conjugated system tend to interact with the empty orbits on a metal surface, it is considered that a stable chelate bond is formed.

Further, since the above atomic group is contained in the ring portion of the five- or six-membered heterocyclic ring, it is considered that the heterocyclic compound is low in steric hindrance, the above atomic group tends to approach metal atoms, and a chelate bond is easily formed.

Striking anticorrosivity shown by a heterocyclic compound having, in the molecule, a five- or six-membered heterocyclic ring containing amide unit or iminohydrin unit is presumed to be due to the above reason.

Also, good biodegradability shown by the above compound is presumed to be associated with the high bioaffinity of amide bond.

In the present invention, specific examples of the heterocyclic compound include purine and its derivatives, such as purine, 6-aminopurine, 2-amino-6-oxopurine, 6-furfurylaminopurine, 2,6-(1H,3H)-purinedione, 2-amino-6-hydroxy-8-mercaptopurine, alloplinol, uric acid, kinetin, zeatin, guanine, xanthine, hypoxanthine, adenine, theophylline, caffeine and theobromine; azaguanine and its derivatives, such as 8-azaguanine; pteridine, pterin and their derivatives, such as pteridine, pterin, 2-amino-4,6-dihydroxypteridine, 2-amino-4,7-dihydroxypteridine and 2-amino-4,6,7-trihydroxypteridine; cyanuric acid, isocyanuric acid and their derivatives, such as cyanuric acid, isocyanuric acid, triscarboxymethylcyanuric acid, triscarboxyethylcyanuric acid, triscarboxymethylisocyanuric acid and triscarboxyethylisocyanuric acid; hydantoin, allantoin and their derivatives, such as hydantoin, dimethylhydantoin and allantoin (5-ureidohydantoin); barbituric acid and its derivatives; and nicotinic acid and its derivatives, such as isonicotinic acid and citrazinic acid. These compounds can be used singly or in combination of two or more kinds. Of these, purine and its derivatives, and nicotinic acid and its derivatives are used preferably. The reason is that they are superior in biodegradability and moreover exhibit excellent anticorrosivity to metals such as copper.

Of the above compounds, purine and its derivatives, in particular, are used preferably because they exhibit excellent anticorrosivity to metals such as copper even in the coexistence of a stripping component such as amine and hydrofluoric acid salt, gives no damage to a semiconductor substrate and various films formed thereon, and gives no adverse effect on steps conducted after a stripping treatment. Especially, the compounds represented by the following general formula (1), most especially, uric acid is used preferably because it is a substance of high safety widely present in nature, is particularly superior in biodegradability and has strikingly excellent anticorrosivity.

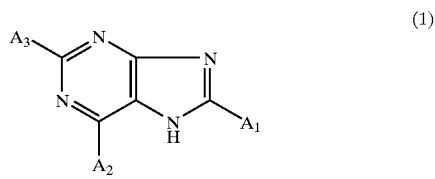

(1)

wherein $A_1$, $A_2$ and $A_3$ are each independently a hydrogen atom, a hydroxyl group, an alkyl group having 1 to 5 carbon atoms or an amino group. In the above formula, at least either of $A_2$ and $A_3$ is desirably a hydroxyl group. Thereby, the heterocycle has an amide bond therein and very good anticorrosivity and biodegradability are obtained.

Incidentally, it is known that in the compound having an amide unit in the cyclic portion, the amide unit is converted into an iminohydrin unit and tautomerism holds between lactam form and lactim form as shown in the following formula. Uric acid, for example, takes the following resonance structure.

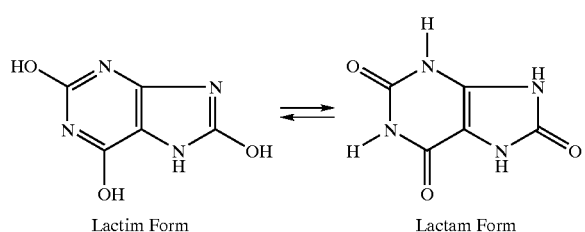

Lactim Form         Lactam Form

In the present invention, the lower limit of the amount of the component (a) is preferably 0.0001% by weight, more preferably 0.001% by weight. With such an amount, very good anticorrosivity is obtained. The upper limit is not critical but is, for example, about 20% by weight, preferably about 10% by weight in view of the solubility of component (a) in stripping solution. Incidentally, in the present specification, the amount of each component is based on the total stripping composition unless otherwise specified.

In the present invention, there can be used, as the component (b), an alkanolamine or a hydrofluoric acid salt.

As specific examples of the alkanolamine, there can be shown monoethanolamine, diethanolamine, N-ethylaminoethanol, N-methylaminoethanol, N-methyldiethanolamine, dimethylaminoethanol, 2-(2-aminoethoxy)ethanol, 1-amino-2-propanol, triethanolamine, monopropanolamine and dibutanolamine. Of these, monoethanolamine and N-methylaminoethanol are particularly preferred.

Alkanolamines such as monoethanolamine, and N-methylaminoethanol show good biodegradability; therefore, when such a compound is selected as a stripping agent component, the resulting stripping composition of the present invention can have higher safety and biodegradability.

A hydrofluoric acid salt can be used as the component (b) when a residue, etc. difficult to remove with an amine type stripping component is removed. Specifically, ammonium fluoride, etc. are used preferably. With a hydrofluoric acid salt, a deposit, etc. adhering to a resist sidewall can be removed.

In the present invention, the upper limit of the amount of the component (b) is preferably 95% by weight, particularly preferably 85% by weight. The lower limit is preferably 1% by weight, particularly preferably 10% by weight. With such an amount, a resist film and an etching residue can be removed very efficiently while good anticorrosivity is maintained.

In the present invention, water can be used as the component (c).

In the present invention, the upper limit of the amount of the component (c) is preferably 90% by weight, particularly preferably 80% by weight. The lower limit is preferably 1% by weight, particularly preferably 5% by weight. With such an amount, the dissolution of the anticorrosive agent is promoted, good anticorrosivity is maintained, and a resist film and an etching residue can be removed very efficiently.

In the present invention, the component (c) may contain a water-soluble organic solvent. As the water-soluble organic solvent, there can be used an organic solvent miscible with water and other components of the present invention.

As such a water-soluble organic solvent, there can be mentioned sulfoxides such as dimethyl sulfoxide; sulfones such as dimethylsulfone, diethylsulfone, bis(2-hydroxyethyl)sulfone and tetramethylenesulfone; amides such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones such as 1,3-dimethyl-2-imidazolidinone, 1,3-diethyl-2-imidazolidinone and 1,3-diisopropyl-2-imidazolidinone; lactones such as γ-butyrolactone and δ-valerolactone; and polyhydric alcohols and their derivatives, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether and diethylene glycol monobutyl ether. These solvents may be used singly or in combination of two or more kinds. Of these, preferred are dimethyl sulfoxide, N,N-dimethylformamide, N,N-dimethylacetamide, N-methyl-2-pyrrolidone, 1,3-dimethyl-2-imidazolidinone, ethylene glycol and diethylene glycol monobutyl ether, for their excellent stripping ability. Particularly preferred is N-methyl-2-pyrrolidone because it is superior also in anticorrosivity to substrate.

The stripping composition of the present invention may comprise only the components (a) to (c) but may further contain other components as necessary unless the characteristics of the present invention are not impaired.

The stripping composition of the present invention can be used for stripping of various resists and can be applied to resists for KrF, made of an aromatic compound, as well as to resists for ArF, made of an alicyclic acrylic polymer or the like. The present stripping composition can be used to, for example, (i) a positive resist containing a naphthoquinone diazide compound and a novolac resin, (ii) a positive resist containing a compound which generates an acid when exposed to a light, a compound which is decomposed by the acid to have an increased solubility in an aqueous alkali solution, and an alkali-soluble resin, (iii) a positive resist containing a compound which generates an acid when exposed to a light and an alkali-soluble resin having a group which is decomposed by the acid to have an increased solubility in an aqueous alkali solution, and (iv) a negative resist containing a compound which generates an acid when exposed to a light, a crosslinking agent and an alkali-soluble resin.

The stripping composition of the present invention aims at removing unnecessary substances present on a semiconductor substrate. The unnecessary substances present on a semiconductor substrate refer to various unnecessary substances produced during production of semiconductor device and include a resist film, an etching residue after dry etching, a chemically modified resist, etc. The present stripping composition is very effective when the substances to be stripped or removed are a resist film and/or an etching residue present on a semiconductor substrate containing an exposed surface of a metal film. When the above metal film is a copper film, the stripping composition of the present invention exhibits anticorrosivity more effectively.

The present invention, when applied to a process using, as an interlayer dielectric material, a low dielectric constant material, for example, a polyorganosiloxane such as MSQ (methylsilsesquioxane), HSQ (hydrogensilsesquioxane) and MHSQ (methylated hydrogensilsesquioxane), or an aromatic-containing organic material such as polyaryl ether (PAE) and divinylsiloxane-bis-benzocyclobutene (BCB), is effective in that the film made of such a material is damaged at a lower extent. These low dielectric constant materials are often utilized as an interlayer dielectric for reduction in capacity between neighboring wirings; however, they have had a problem of low ashing resistance and, when subjected to plasma, increased dielectric constant. Therefore, it is desired to make the time of ashing as short as possible and the conditions of ashing as mild as possible. This makes essential a treatment using a stripping solution having a strong stripping action. Such a stripping component of strong stripping action, however, inevitably shows a strong corrosivity to wiring materials such as copper; therefore, an anticorrosive component stronger than before is needed. Thus, in a process using the above-mentioned low dielectric constant material, the present invention exhibits its effect more strikingly.

The present invention is effective when applied to a resist film and/or an etching residue both present on a semiconductor wafer containing an exposed surface of a metal film, and particularly effective when the metal film is made of copper or a copper alloy made mainly of copper. The copper alloy made mainly of copper is a copper alloy containing copper in an amount of 90% by weight or more and other elements such as Mg, Sc, Zr, Hf, Nb, Ta, Cr, and Mo. These metals have low resistances and increase the high-speed operability of chip but tend to show corrosion (dissolution, modification, etc.) when exposed to a chemical solution; therefore, the present invention shows a striking effect to these metals.

Next, there is shown, as an application example of the stripping composition of the present invention, a case of forming a interlayer contact plug on copper wiring by a single damascene process.

First, as shown in FIG. 1(a), on a semiconductor substrate (not shown) having elements such as transistor, formed thereon are formed a silicon oxide film 1, a silicon nitride film 2 and a silicon oxide film 3. Then, a copper wiring consisting of a barrier metal film 4 and a copper film 5 is formed using a known damascene process utilizing chemical mechanical polishing (CMP). Thereon are formed a silicon nitride film 6 having a thickness of about 50 to 100 nm and an interlayer dielectric (a silicon oxide film or a low dielectric constant film) 7 having a thickness of about 600 to 1,000 nm. The thickness of the copper film 5 can be selected as desired, but is preferably set at, for example, 350 nm or less for a lower parasitic capacity between neighboring wirings. When the thickness of the copper wiring is small, the thickness of the corroded layer relative to the total copper wiring layer becomes relatively large and an increase in wiring resistance, caused by the corrosion of copper surface becomes a big problem; however, with the stripping composition of the present invention, such a problem is solved and the thickness of the copper wiring layer can be made small. Incidentally, in the present embodiment, the thickness of the silicon nitride film 6 is set at about 50 to 100 nm; however, the thickness may be larger than that to enhance the function as an etching-preventing film.

Next, on the interlayer dielectric film 7 is provided a resist film 8 in a predetermined pattern [FIG. 1(b)].

Next, the interlayer dielectric film 7 is dry-etched using the resist film 8 as a mask, until the silicon nitride film 6 is exposed, whereby a throughhole 10 is formed [FIG. 1(c)]. At this time, an etching residue 11 adheres to the inner wall of the throughhole 10. The diameter of the throughhole is set at about 0.2 µm. The etching gas used is preferably a gas capable of etching the interlayer dielectric film at a larger etching rate than etching the silicon nitride film.

Here, the silicon nitride film 6 has a function for prevention of copper diffusion and, besides, a function as an etching-stopper film; however, as shown in FIG. 1(c), the controlled stoppage of dry etching on the silicon nitride film 6 is impossible in some cases. The reason is as follows: In a process such as the present embodiment, throughholes of various diameters are generally formed on a semiconductor wafer. In throughholes of small diameters, the rate of etching is small owing to a microloading effect. Hence, it becomes necessary to take a certain overetching time in the etching for throughholes formation; as a result, the silicon nitride film 6 is etched in part of the throughholes and part of the copper film 5 is exposed. Further, when a hollow appears (dishing) on, for example, the copper film 5, the silicon nitride film 6 generates a thin film portion and is etched at this portion, which may result in exposure of part of the copper film 5. This exposure of the copper film 5 can be prevented by forming a silicon nitride film 6 of large thickness in the step shown in FIG. 1(a); in this case, however, the capacity between neighbonng copper wirings becomes large and the high-speed operation of semiconductor elements tends to be hindered.

After the completion of the etching, part of the resist film 8 is removed by oxygen plasma ashing, after which a stripping treatment is conducted using the stripping composition of the present invention. By this stripping treatment, the resist film and the etching residue 11, which have not been removed sufficiently in the ashing, are removed. As described above, the copper film 5 is exposed in at least part of the throughholes, after the etching; therefore, the stripping composition needs to have anticorrosivity to copper. By using a stripping composition containing the above-mentioned components (a) and (b), the resist film and the etching residue 11 can be removed effectively without any damage to the copper film 5. A state after the completion of the stripping treatment is shown in FIG. 2(a).

Then, etching of the silicon nitride film 6 is conducted by changing etching gas. At this time, an etching residue 12 adheres to the inner wall of the throughhole 10 [FIG. 2(b)]. In order to remove the etching residue 12, a stripping treatment is conducted again using the above-mentioned stripping composition. At this stage of stripping treatment, the copper film 5 is exposed at the bottom of the throughhole 10; however, use of the stripping composition containing the components (a) and (b) allows removal of the etching residue 12 without giving any damage to the copper film 5 [FIG. 2(c)].

Then, inside the throughhole are formed a barrier metal film 14 (which consists of a Ti layer and a TiN layer in this order) and a tungsten film 15, after which CMP is conducted for planarizing, to form an interlayer contact plug [FIG. 2(d)].

EXAMPLE 1

Stripping compositions of the present invention were applied to steps for throughhole formation on a copper wiring, for evaluation of their stripping performances and anticorrosivity.

Figure 2:
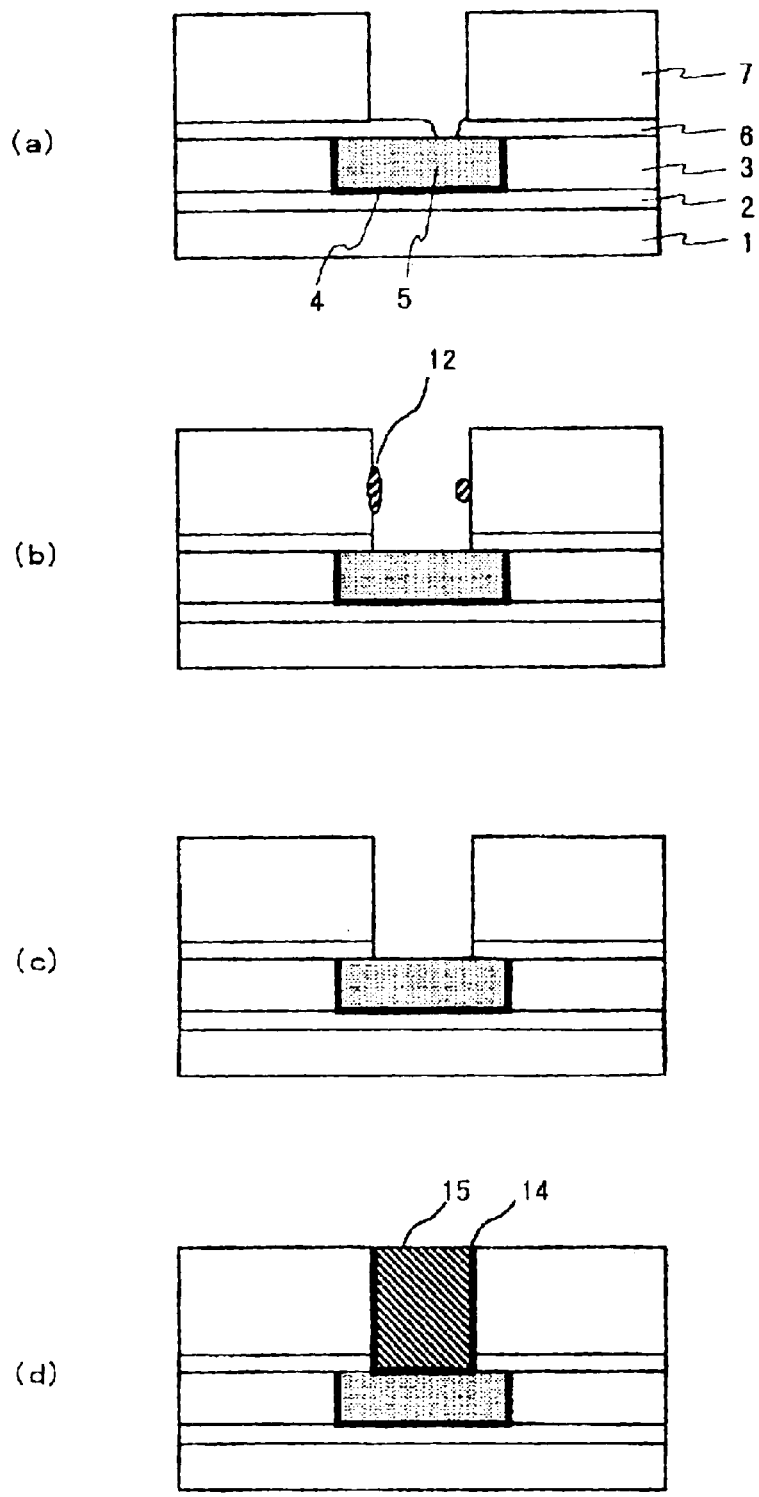
FIGS. 2(a)–2(d) are sectional views explaining steps for throughhole formation process.

Samples to be examined were produced according to the same steps as shown in FIG. 1 to FIG. 2(c). First, a copper wiring was formed on a silicon wafer; thereon were formed a silicon nitride film having a thickness of 90 nm and an interlayer dielectric film (HSQ or MSQ) having a thickness of 900 nm. Then, a positive resist film was formed by spinner coating. As the material for the resist film, there was used "PEX 4" (produced by Tokyo Ohka Kogyo Co., Ltd.) which was a material for positive resist for KrF). The resist film was exposed to a light via a mask pattern and subjected to development using an aqueous tetramethylammonium hydroxide solution to obtain a resist pattern.

Using this resist film as a mask, the interlayer dielectric film was dry-etched until the silicon nitride film was exposed, to form a throughhole having a diameter of 0.2 μm. As the gas for etching, a fluorocarbon-based gas was used. After the completion of the etching, part of the resist film was removed by oxygen plasma ashing, after which a stripping treatment was conducted using a stripping composition shown as No. 1 in Table 1.

Next, the silicon nitride film was etched using a different etching gas, to expose the copper wiring at the bottom of the throughhole. In order to remove the residue generated by this etching, a stripping treatment was conducted again using the same stripping composition (No. 1 in Table 1) as used in the previous stripping treatment.

The same operation was conducted for stripping compositions Nos. 2 to 17 shown in Table 1, to produce total 17 kinds of samples.

The wafers after the above treatment were rinsed with pure water and then subjected to sectional observation using a scanning electron microscope (SEM) to evaluate (1) stripping performance of resist film and etching resist and (2) anticorrosivity to copper film. The standard for evaluation was as follows:

(Stripping Performance)

The residual conditions of resist film and etching residue were observed and rated according to the following four stages:

⊚: There was no residue.

○: There was substantially no residue.

Δ: There was a small amount of residue.

X: There was a large amount of residue.

(Anticorrosivity)

The conditions of corrosion of copper film surface were observed and rated according to the following four stages:

⊚: There was no corrosion in copper film.

○: There was slight corrosion in copper film.

Δ: There was corrosion in copper film.

X: There was striking corrosion in copper film.

(HSQ Damage)

The surface condition of HSQ film, when HSQ was used as a low dielectric film, was observed and rated according to the following four stages:

⊚: There was no damage.

○: There was slight damage.

Δ: There was damage.

X: There was striking damage.

(MSQ Damage)

The surface condition of MSQ (methylated HSQ) film, when MSQ was used as a low dielectric film, was observed and rated according to the following four stages:

⊚: There was no damage.

○: There was slight damage.

Δ: There was damage.

X: There was striking damage.

TABLE 1

| | Stripping solution composition | | | Rating | | | |
|---|---|---|---|---|---|---|---|
| Stripping solution No. | Anticorrosive agent (wt. %) | Stripping agent (wt. %) | Water | Stripping performance | Anticorrosivity to Cu | HSQ damage | MSQ damage |
| 1 | Uric acid (1 × 10⁻⁵) | NMAE (40) | Remaining part | Δ | Δ | Δ | Δ |
| 2 | Uric acid (1 × 10⁻⁴) | NMAE (40) | Remaining part | Δ | ○ | Δ | Δ |
| 3 | Uric acid (0.01) | NMAE (40) | Remaining part | ○ | ⊚ | Δ | Δ |
| 4 | Uric acid (0.01) | NMAE (80) | Remaining part | ⊚ | ⊚ | ○ | ○ |
| 5 | Uric acid (1) | NMAE (90) | Remaining part | ⊚ | ⊚ | ⊚ | ⊚ |
| 6 | Uric acid (1) | NMAE (95) | Remaining part | ⊚ | ⊚ | ⊚ | ⊚ |
| 7 | Uric acid (1) | MEA (80) | Remaining part | ⊚ | ⊚ | ○ | ○ |
| 8 | Uric acid (1 × 10⁻⁴) | MEA (60) | Remaining part | ⊚ | Δ | Δ | Δ |
| 9 | Uric acid (0.01) | MEA (40) | Remaining part | Δ | Δ | Δ | X |
| 10 | Uric acid (0.01) | MEA (80) | Remaining part | ○ | Δ | ○ | ○ |
| 11 | Adenine (1) | NMAE (90) | Remaining part | ⊚ | ⊚ | ⊚ | ⊚ |
| 12 | Caffeine (90) | NMAE (90) | Remaining part | ○ | Δ | ⊚ | ⊚ |
| 13 | Purine (1) | NMAE (90) | Remaining part | ⊚ | ⊚ | ⊚ | ⊚ |
| 14 | Pterin (0.1) | NMAE (90) | Remaining part | ⊚ | ○ | ⊚ | ⊚ |
| 15 | Cyanuric acid (1) | NMAE (90) | Remaining part | ⊚ | ○ | ⊚ | ⊚ |

TABLE 1-continued

| Stripping solution No. | Stripping solution composition | | | Rating | | | |
|---|---|---|---|---|---|---|---|
| | Anticorrosive agent (wt. %) | Stripping agent (wt. %) | Water | Stripping performance | Anticorrosivity to Cu | HSQ damage | MSQ damage |
| 16 | Nicotinic acid (1) | NMAE (90) | Remaining part | ◎ | Δ | ◎ | ◎ |
| 17 | BTA (1) | NMAE (90) | Remaining part | ◎ | ◎ | ◎ | ◎ |

*1:
"Residue" in water amount refers to a residue when the amounts of anticorrosive agent and stripping agent have been subtracted from 100% by weight.
*2:
NMAE refers to N-methylaminoethanol.
MEA refers to monoethanolamine.
BTA refers to benztriazole.

From the above it is seen that the stripping composition of the present invention has excellent stripping performance and anticorrosivity. Incidentally, in the present Example, the present invention was applied to a single damascene process; however, the present invention can be applied also to a so-called dual damascene process.

EXAMPLE 2

A silicon wafer having a copper film formed on the whole substrate surface was immersed in a given stripping solution at 80° C. for 10 minutes. The etching rate of copper was measured from the thicknesses of the copper films before and after immersion. As the stripping solution, there were used those having the following compositions. Incidentally, 2N ammonia water was added to exclude the influence of the pH variation caused by the difference in addition amount of uric acid, and pH was controlled at 11.

Amine: 80% by weight

Uric acid: 0, 0.0001, 0.001, 0.01, 0.1 or 1% by weight

Water: Remaining part

Figure 3:
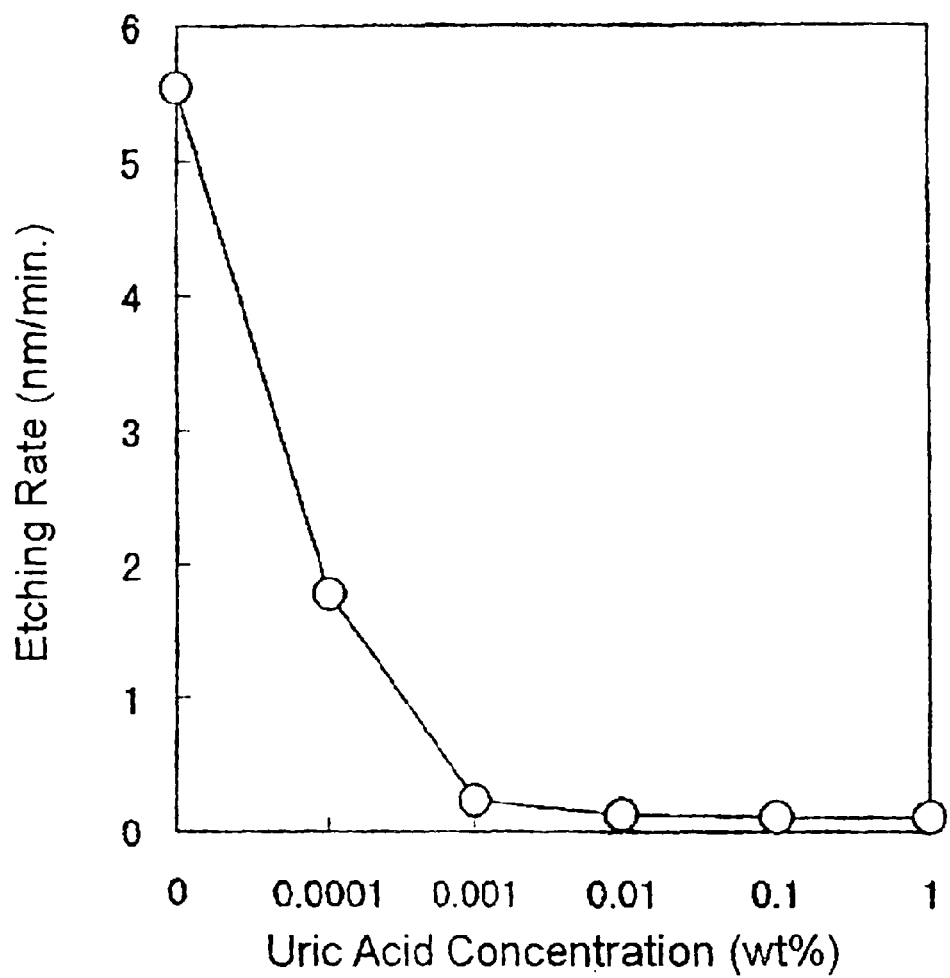
FIG. 3 is a graph showing an effect of uric acid concentration on etching rate of copper film.

As the amine, NMAE (N-methylaminoethanol) was used. The results are shown in FIG. 3. When, in FIG. 3, the etching rate shown by the axis of ordinate exceeds 4 nm/min, corrosion of copper film becomes striking. It is seen from FIG. 3 that excellent anti corrosivity is exhibited by addition of uric acid.

EXAMPLE 3

The stripping components which had shown good results in Table 2, were evaluated for biodegradabiliity according to a biodegradability test method based on the MITI method. That is, a sample was added to an inorganic medium so as to give a concentration of 100 mg/liter; an activated sludge was added thereto; cultivation was conducted at 25° C.; amount of oxygen consumed and residual amount of sample were measured using a closed system oxygen consumption tester, to determine a decomposition ratio from the amount of oxygen consumed; and biodegradability was judged according to the following rating standard.

◎: Decomposition ratio was 60% or more.

○: Decomposition ratio was 40% to less than 60%.

Δ: Decomposition ratio was 10% to less than 40%.

X: Decomposition ratio was less than 10%.

The results of rating are shown in Table 2.

TABLE 2

| Sample | Biodegradability |
|---|---|
| Uric acid | ◎ |
| Adenine | ◎ |
| Caffeine | ◎ |
| Pterin | ◎ |
| Cyanuric acid | Δ |
| Nicotinic acid | ◎ |
| BTA | X |
| MEA | ◎ |
| NMAE | ◎ |

BTA: benztriazole
MEA: monoethanolamine
NMAE: N-methylaminoethanol

EXAMPLE 4

In this Example, stripping compositions according to the present invention were applied to a process for throughhole formation on a copper wiring. Ammonium fluoride having a strong stripping action was used as a stripping component. Substantially the same process as in Example 1 was used; however, since the thickness of nitride film and the kind of etching gas were slightly different, each deposit to be stripped was different from those of Example 1. The results of rating are shown in the following table. The standards for rating of stripping performance and anticorrosivity were the same as in Example 1. The stripping compositions using uric acid showed about the same stripping performance and anticorrosivity as a BTA derivative.

TABLE 3

| Stripping solution No. | Peeing solution composition | | Rating | |
|---|---|---|---|---|
| | Anticorrosive agent (wt %) | Stripping component | Stripping performance | Corrosivity |
| 1 | Uric acid (0.01) | DMSO (69), ammonium fluoride (1), water (residue) | ◎ | Δ |
| 2 | Uric acid (1) | DMSO (68), ammonium fluoride (1), water (residue) | ◎ | ○ |

TABLE 3-continued

| Strip- ping so- lution No. | Peeing solution composition | | Rating | |
|---|---|---|---|---|
| | Anticorrosive agent (wt %) | Stripping component | Stripping perform- ance | Corro- sivity |
| 3 | Uric acid (0.01) | NMP (69), ammonium fluoride (1), water (residue) | ○ | Δ |
| 4 | BTA derivative (1) | DMSO (68), ammonium fluoride (1), water (residue) | ⊚ | ○ |
| 5 | None | DMSO (69), ammonium fluoride (1), water (residue) | ○ | X |

NMP: N-methyl-2-pyrrolidone
DMSO: dimethyl sulfoxide

INDUSTRIAL APPLICABILITY

As described above, the stripping composition of the present invention contains a heterocyclic compound of particular structure as an anticorrosive agent. Therefore, the present stripping composition can effectively remove a resist film and an etching residue while preventing corrosion of copper, is superior in safety, and is biodegradable and easy to treat its wastewater. Hence, the composition can be preferably used in, for example, production of a semiconductor device having a copper wiring formed therein.

What is claimed is:

1. A stripping composition comprising (a) an anticorrosive agent, (b) an alkanolamine and (c) water, wherein the anticorrosive agent (a) is a readily biodegradable heterocyclic compound having a nitrogen atom-containing six-membered ring.

2. A stripping composition according to claim 1, wherein the alkanolamine (b) is readily biodegradable.

3. A stripping composition according to claim 1, wherein the anticorrosive agent (a) is a compound represented by the following general formula (1)

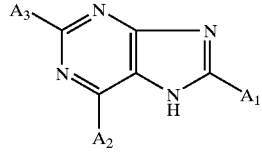

(1)

wherein $A_1$, $A_2$ and $A_3$ are each independently a hydrogen atom, a hydroxyl group, an alkyl group having 1 to 5 carbon atoms or an amino group.

4. A stripping composition according to claim 1, wherein the anticorrosive agent is readily biodegradable purine or a derivative thereof.

5. A stripping composition according to claim 1, wherein the anticorrosive agent (a) is uric acid.

6. A stripping composition according to claim 1, wherein the anticorrosive agent (a) is adenine.

7. A stripping composition according to claim 1, wherein the alkanolamine is one compound or two or more compounds selected from the group consisting of monoethanolamine, N-methylaminoethanol, 2-(2-aminoethoxyethanol), N-methyldiethanolamine and 1-amino-2-propanol.

8. A stripping composition according to claim 1, wherein the components (a), (b) and (c) are contained in amounts of 0.0001 to 20% by weight, 1 to 95% by weight and 1 to 90% by weight, respectively.

9. A stripping composition according to claim 8, wherein the component (a) is contained in an amount of 0.001 to 1% by weight.

10. A stripping method which comprises removing a resist film and/or an etching residue, present on a semiconductor wafer containing an exposed surface of a copper film and/or a copper alloy film, using a stripping composition according to claim 1.

* * * * *